US010615877B2

(12) United States Patent
Saad et al.

(10) Patent No.: US 10,615,877 B2
(45) Date of Patent: Apr. 7, 2020

(54) ELECTRO-ABSORPTION BIAS CIRCUIT FOR ELECTRO-ABSORPTION MODULATORS

(71) Applicant: Lumentum Operations LLC, Milpitas, CA (US)

(72) Inventors: Ricardo Saad, Plano, TX (US); Linda Liu, Milpitas, CA (US); Yu-Ting Hsueh, Milpitas, CA (US); Goutham Kumar, Milpitas, CA (US)

(73) Assignee: Lumentum Operations LLC, Milpitas, CA (US)

( * ) Notice: Subject to any disclaimer, the term of this patent is extended or adjusted under 35 U.S.C. 154(b) by 23 days.

(21) Appl. No.: 15/987,515

(22) Filed: May 23, 2018

(65) Prior Publication Data

US 2019/0068288 A1 Feb. 28, 2019

Related U.S. Application Data

(60) Provisional application No. 62/550,511, filed on Aug. 25, 2017.

(51) Int. Cl.
| | |
|---|---|
| *H04B 10/50* | (2013.01) |
| *G02F 1/01* | (2006.01) |
| *G02F 1/015* | (2006.01) |
| *H04B 10/564* | (2013.01) |
| *H01S 5/068* | (2006.01) |
| *H01S 5/026* | (2006.01) |
| *H04B 10/80* | (2013.01) |
| *H01S 5/00* | (2006.01) |
| *H01S 5/0683* | (2006.01) |

(52) U.S. Cl.
CPC ....... *H04B 10/50595* (2013.01); *G02F 1/015* (2013.01); *G02F 1/0123* (2013.01); *H01S 5/0265* (2013.01); *H01S 5/06804* (2013.01); *H04B 10/5059* (2013.01); *H04B 10/50593* (2013.01); *H04B 10/564* (2013.01); *H04B 10/808* (2013.01); *G02F 2001/0157* (2013.01); *G02F 2203/60* (2013.01); *H01S 5/0085* (2013.01); *H01S 5/0683* (2013.01)

(58) Field of Classification Search
CPC ............ B82Y 20/00; H01L 2924/0132; H01L 2924/00014; H01L 2924/01079; G02F 1/025
USPC ......................................................... 359/248
See application file for complete search history.

(56) References Cited

U.S. PATENT DOCUMENTS

2005/0025500 A1* 2/2005 Hallemeier .............. G02B 6/14
398/186
2005/0058460 A1* 3/2005 Wang ................... H04B 10/503
398/195

(Continued)

*Primary Examiner* — Mohammed A Hasan
(74) *Attorney, Agent, or Firm* — Harrity & Harrity, LLP

(57) ABSTRACT

An electro-absorption bias circuit may include a temperature sensor. The electro-absorption bias circuit may include a controller to provide a temperature-dependent control signal based on data received from the temperature sensor. The electro-absorption bias circuit may include a power supply to provide an output voltage based on the temperature-dependent control signal from the controller. The electro-absorption bias circuit may include an electro-absorption driving circuit to output a bias voltage applied to the output voltage provided by the power supply.

23 Claims, 3 Drawing Sheets

(56) References Cited

U.S. PATENT DOCUMENTS

| | | | |
|---|---|---|---|
| 2012/0269215 A1* | 10/2012 | Lv | H01S 5/0265 |
| | | | 372/28 |
| 2012/0301151 A1* | 11/2012 | Hu | H04B 10/40 |
| | | | 398/135 |
| 2018/0196287 A1* | 7/2018 | Hissen | G02F 1/015 |

* cited by examiner

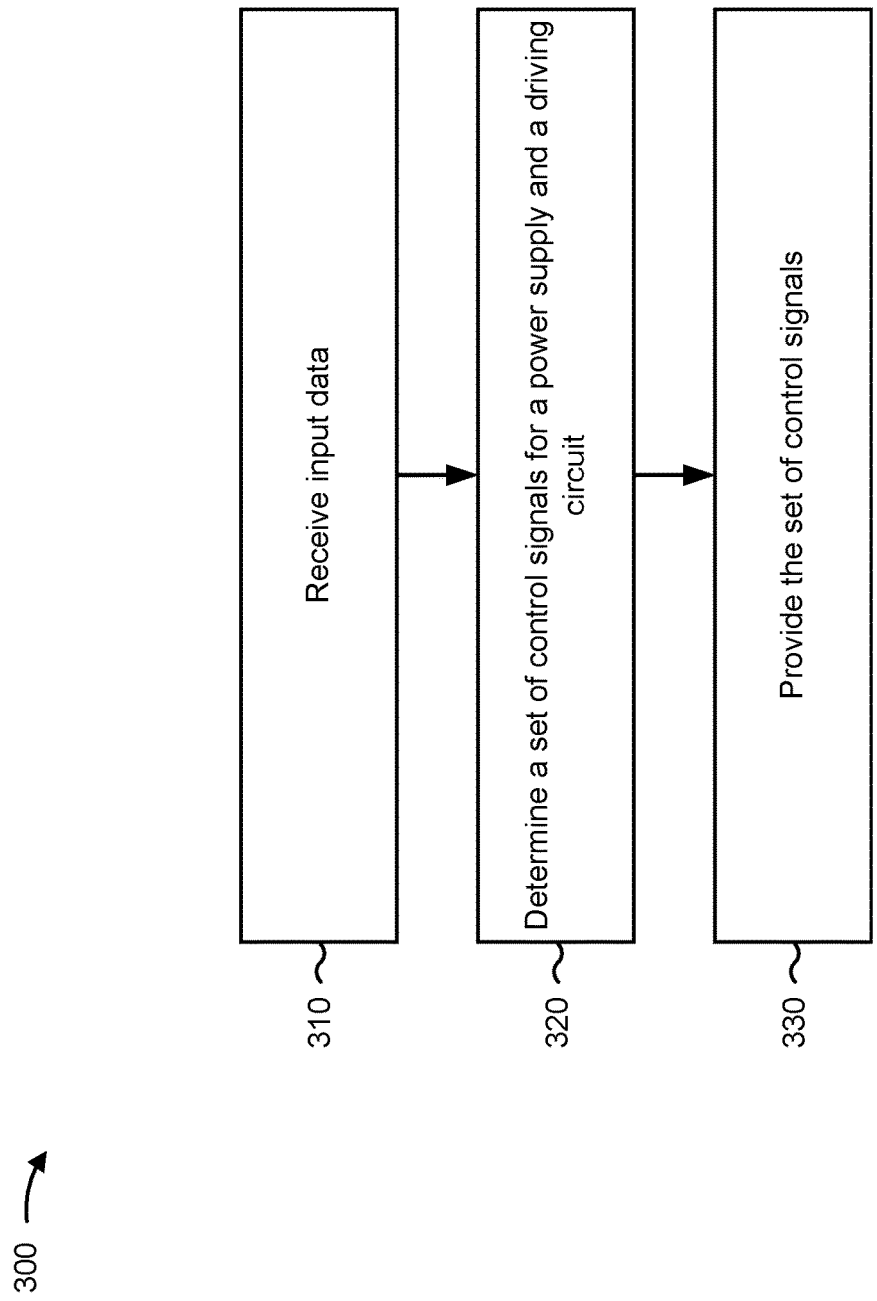

ELECTRO-ABSORPTION BIAS CIRCUIT FOR ELECTRO-ABSORPTION MODULATORS

RELATED APPLICATION(S)

This application claims priority under 35 U.S.C. § 119 to U.S. Provisional Patent Application No. 62/550,511, filed on Aug. 25, 2017, the content of which is incorporated by reference herein in its entirety.

TECHNICAL FIELD

The present disclosure relates to electro-absorption bias circuits for electro-absorption modulators. More particularly, some aspects of the present disclosure relate to an electro-absorption modulator that dynamically adjusts an output voltage of a variable negative voltage power supply to an electro-absorption driving circuit based on a temperature of an electro-absorption modulator to reduce a power dissipation requirement and/or a power consumption of an optical device, such as an optical transceiver, an optical subsystem, an optical subassembly, and/or the like.

BACKGROUND

Optical communication systems may be used for high-speed, long-range optical communications. An optical device, of an optical communication system, may include a transmitter. Alternatively, the optical device may include a transceiver. The optical device may include a laser to provide a beam. For example, the optical device may include a distributed feedback (DFB) laser, a laser diode, and/or the like. The laser may be optically coupled to a modulator to modulate the beam for optical communications. In some cases, the laser may be a directed DFB laser that provides a modulated beam. Alternatively, an electro-absorption modulator may be coupled to the DFB laser to apply an electric field to modulate the beam and provide a modulated beam.

An electro-absorption modulator may be coupled to an electro-absorption bias circuit to control a bias of the electro-absorption modulator. The electro-absorption bias circuit may include an electro-absorption driving circuit that receives an input voltage from a power supply, and provides a bias voltage to the electro-absorption modulator. A controller or another type of processing device (e.g., a controller, a microprocessor, and/or the like) or circuitry may provide a signal to control the electro-absorption driving circuit. The controller may provide the signal to the electro-absorption driving circuit to cause the electro-absorption driving circuit to adjust the bias voltage provided to the electro-absorption modulator.

The controller may determine the signal to provide to the electro-absorption driving circuit based on a sensor signal from a sensor (e.g., a sensor inside the controller, a sensor external to the controller, and/or the like). For example, when an operating temperature of an optical package that includes the electro-absorption modulator is less than a threshold value, the controller may receive a sensor signal from a temperature sensor. In this case, the controller may provide a signal to the electro-absorption driving circuit to cause the bias voltage, provided by the electro-absorption driving circuit, to be reduced to less than a threshold voltage (i.e., the bias voltage is adjusted to be more negative). Similarly, when the operating temperature is greater than a threshold value, the bias voltage provided by the electro-absorption driving circuit may be increased to greater than a threshold voltage (the bias voltage is adjusted to be less negative). Based on the electro-absorption modulator receiving the bias voltage, the electro-absorption modulator may modulate the beam to generate the modulated beam, which is provided to enable optical communications.

SUMMARY

According to some possible implementations, an electro-absorption bias circuit may include a temperature sensor. The electro-absorption bias circuit may include a controller to provide a temperature-dependent control signal based on data received from the temperature sensor. The electro-absorption bias circuit may include a power supply to provide an output voltage based on the temperature-dependent control signal from the controller. The electro-absorption bias circuit may include an electro-absorption driving circuit to output a bias voltage applied to the output voltage provided by the power supply According to some possible implementations, an optical device may include a control device. The optical device may include a modulator bias circuit. The modulator bias circuit may be to include a variable negative voltage power supply to provide a negative voltage that is a function of a temperature associated with the optical device. The negative voltage power supply may be to receive a control signal from the control device to control the negative voltage provided by the variable negative voltage power supply. The optical device may include a transmit optical sub-assembly (TOSA). The TOSA may be to include a laser diode to provide a beam. The TOSA may be to include an electro-absorption modulator to modulate the beam based on the negative voltage.

According to some possible implementations, a method may include receiving, by a control device, input data. The input data may include information identifying a temperature associated with a laser diode and an electro-absorption modulator. The method may include determining, by the control device, a set of control signals for a power supply and a driving circuit. The set of control signals may be to alter a bias applied to the electro-absorption modulator based on the temperature. The method may include providing the set of control signals to the power supply and the driving circuit to alter an output voltage of the power supply applied to the driving circuit based on the temperature and to alter the bias applied by the driving circuit to the electro-absorption modulator based on the temperature.

BRIEF DESCRIPTION OF THE DRAWINGS

FIG. 3 is a flow chart of a method for controlling an electro-absorption bias circuit for an electro-absorption modulator described herein.

DETAILED DESCRIPTION

The following detailed description of example implementations refers to the accompanying drawings. The same reference numbers in different drawings may identify the same or similar elements.

A transmit optical sub-assembly (TOSA) may be used for high-speed data communication applications in an optical transceiver module of an optical communications network. The TOSA may receive an input electrical signal and may provide, as an output optical signal, a modulated beam. The TOSA may be coupled to a fiber to enable optical communications using the output optical signal. The TOSA may include an electro-absorption modulator to modulate a beam to form the modulated beam. In some cases, the TOSA may be associated with a data rate greater than 50 gigabits per second (G/s), 100 G/s, 200 G/s, 400 G/s, and/or the like. In some cases, the TOSA may be a 10 G/s TOSA, a 25 G/s TOSA, a 40 G/s TOSA, 4×25 G/s TOSA, a 4×28 G/s TOSA, an 4×50 G/s TOSA, an 8×50 G/s TOSA, a 4×100 G/s TOSA, and/or the like. However, transmission of data at data rates greater than a threshold, such as greater than 50 G/s, greater than 100 G/s, greater than 200 G/s, greater than 400 G/s, and/or the like, may result in excessive power dissipation requirements for a transceiver, a TOSA, a subsystem, and/or the like. This may cause excessive heating of components, may result in excessively large form factors to include power dissipation components, and/or the like. It may therefore be advantageous to reduce power dissipation requirements, thereby enabling reduced temperature strain on components, reduced form factor, increased achievable data rates, and/or the like.

Some implementations, described herein, may provide an electro-absorption bias circuit for an electro-absorption modulator. For example, some implementations, described herein, may provide a controller controlling a negative power supply based on temperature. In this way, some implementations, described herein, may reduce a power dissipation requirement for an electro-absorption modulator and/or a TOSA that includes the electro-absorption modulator. Moreover, some implementations, described herein, may reduce a power utilization by the negative power supply relative to another technique whereby a negative power supply provides a constant voltage to an electro-absorption driving circuit.

Figure 1:
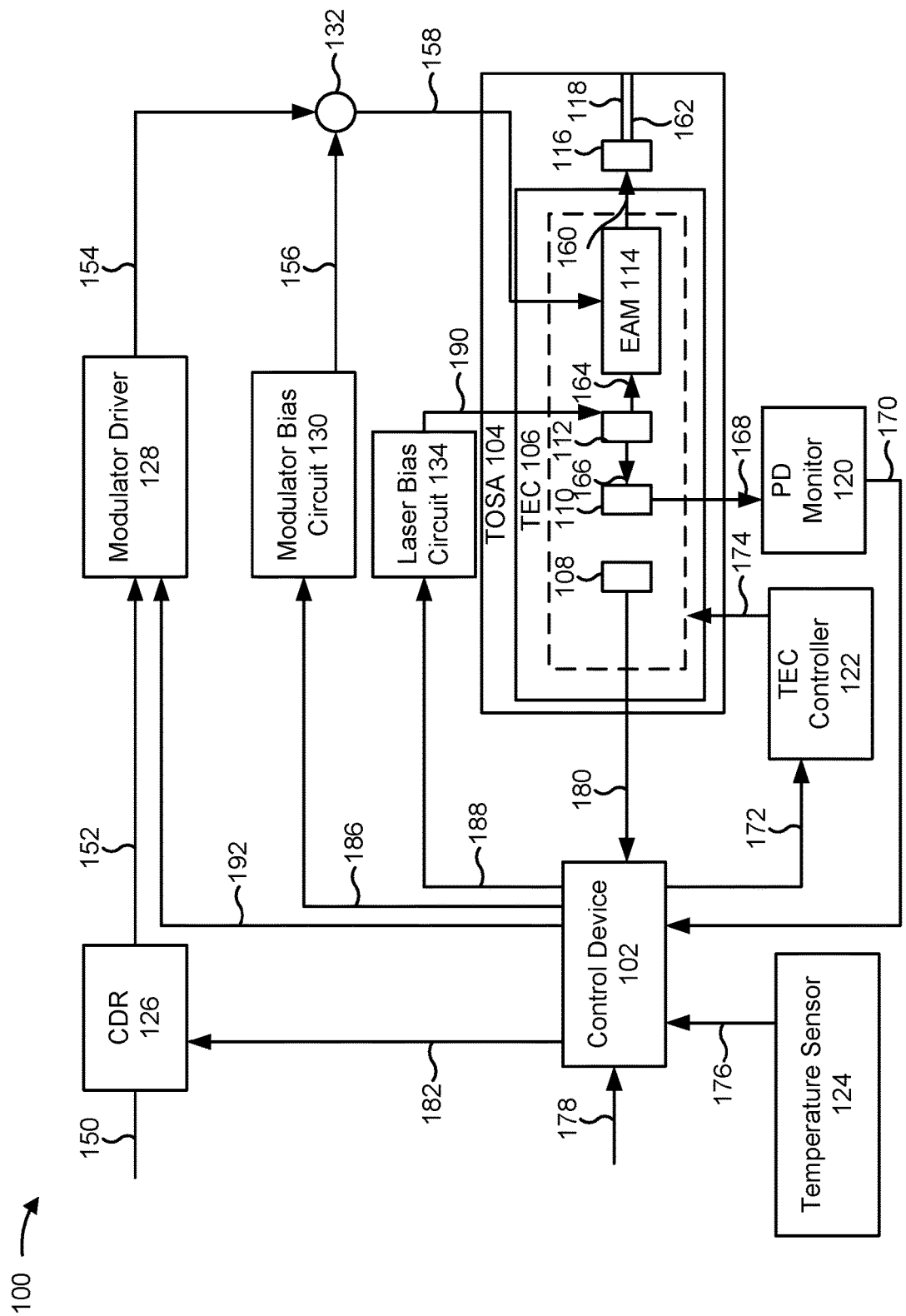
FIG. 1 is a diagram of an overview of an example implementation described herein.

FIG. 1 is a diagram of an overview of an example implementation of an optical device 100 described herein. As shown in FIG. 1, optical device 100 includes a control device 102, a TOSA 104, a thermo-electric cooler 106 (shown as TEC 106), a thermistor 108, a photodiode 110, a laser diode 112, an electro-absorption modulator 114 (shown as EAM 114), a lens 116, a fiber 118, a photodiode monitor 120, a thermo-electric cooler controller 122 (shown as TEC controller 122), a temperature sensor 124, a clock and data recovery circuit 126 (shown as CDR 126), a modulator driver 128, a modulator bias circuit 130, a laser bias circuit 134, and a set of signals (e.g., optical signals and electrical signals) 150-192.

Control device 102 includes one or more components to control biasing for electro-absorption modulator 114. For example, control device 102 may include a control device, such as a processor, a controller, an analog circuit, a microcontroller, a microprocessor, and/or the like. In some implementations, control device 102 may include a set of digital-to-analog converters that receive signals 170, 176, 178, and 180 as input and provide signals 172, 182, 186, 188, and 192 as output. In some implementations, control device 102 may receive signal 178 from a control device, a server, and/or the like. For example, control device 102 may receive an inter-integrated circuit (I2C) signal or a management data input/output (MDIO) signal to enable operator control of control device 102.

TOSA 104 includes one or more components to provide an output optical signal 160 based on an input electrical signal 150. In some implementations, TOSA 104 may include thermo-electric cooler 106, which ensures that a threshold operating temperature or temperature range is maintained for other components of TOSA 104. In some implementations, TOSA 104 may omit thermo-electric cooler 106. For example, based on TOSA 104 using another technique for cooling, such as a passive cooling technique, another type of active cooling technique, and/or the like, TOSA 104 may omit thermo-electric cooler 106. In some implementations, thermo-electric cooler 106 may be omitted based on performing temperature-dependent control of an electro-absorption bias circuit, thereby reducing cost, reducing power consumption (e.g., of thermo-electric cooler 106) and/or the like. Similarly, using temperature-dependent control of the electro-absorption bias circuit, as described in more detail herein, utilization of thermo-electric cooler 106 may be reduced (e.g., thermo-electric cooler 106 may only be used for temperatures outside of a threshold range), thereby reducing power consumption relative to using thermo-electric cooler 106 at all temperatures. In some implementations, TOSA 104 may include photodiode 110 to monitor an output of laser diode 112, such as for tuning, data recovery, and/or the like. For example, TOSA 104 may include a photodiode 110 that is optically coupled to an output of laser diode 112 or to another component in the optical path, such as electro-absorption modulator 114, lens 116, fiber 118, and/or the like.

In some implementations, TOSA 104 may include laser diode 112 to provide a beam 164, 166 that is modulated by electro-absorption modulator 114, monitored by photodiode 110, and/or the like. For example, TOSA 104 may include a forward biased laser diode 112 coupled to a reverse biased electro-absorption modulator 114, as described herein. In some implementations, TOSA 104 (e.g., electro-absorption modulator 114) may provide a modulated output optical signal 160 to lens 116, which is coupled to fiber 118 or a planar lightwave circuit (PLC).

Photodiode monitor 120 includes one or more components to monitor photodiode 110, which monitors laser diode 112. For example, photodiode monitor 120 may receive signal 168 from photodiode 110 based on photodiode 110 monitoring beam portion 166 output by laser diode 112. In this case, photodiode monitor 120 may provide signal 170 as output to control device 102 to enable control device 102 to, for example, provide signal 188 to control laser bias circuit 134, and cause laser bias circuit 134 to provide signal 190 to alter an input provided to photodiode 110.

Thermo-electric cooler controller 122 includes one or more components to control thermo-electric cooler 106. In some implementations, thermo-electric cooler controller 122 may receive a signal 172 from control device 102. Control device 102 may provide signal 172 based on receiving, for example, signal 180 from thermistor 108 identifying an operating temperature of TOSA 104, signal 176 from temperature sensor 124 identifying an ambient temperature for TOSA 104, and/or the like. In this case, thermo-electric cooler controller 122 may provide signal 174 to thermo-electric cooler 106 to cause thermo-electric cooler 106 to maintain or alter an operating temperature of TOSA 104.

Temperature sensor 124 includes one or more components to determine an ambient temperature for optical device 100, TOSA 104 or components thereof. For example, temperature sensor 124 may include a thermistor, a thermocouple, a semiconductor-based temperature sensor, and/or the like to determine an ambient temperature of a location at which TOSA 104 is operating and provide signal 176 to identify the ambient temperature to control device 102. In this case, control device 102 may provide signal 172 to thermo-electric cooler controller 122 to control thermo-electric cooler 106 of TOSA 104. Additionally, or alternatively, control device 102 may provide signal 186 to modulator bias circuit 130 to control a voltage output of a power supply for TOSA 104 based on receiving signal 176 from temperature sensor 124, thereby enabling a reduction of a power dissipation requirement for TOSA 104 relative to utilizing a constant output for the power supply (e.g., a constant negative voltage). In some implementations, temperature sensor 124 may be disposed inside of TOSA 104, in a printed circuit board (PCB) associated with TOSA 104, inside a controller, and/or the like.

Clock and data recovery circuit 126 includes one or more components to perform a clock and data recovery operation using signal 182, data signal 150, and/or signal 152. For example, signal 182 may provide bidirectional data to clock and data recovery circuit 126 and/or to control device 102 (e.g., a controller). In this case, data from clock and data recovery circuit 126 may be status information regarding alarms, settings, and/or the like, and data to clock and data recovery circuit 126 may control the clock and data recovery operation. In some implementations, signal 150 may be a radio frequency signal containing electrical data to be modulated into an optical data signal. In some implementations, signal 182 may be a clock and data recovery signal.

Modulator driver 128 includes one or more components to drive electro-absorption modulator 114. For example, modulator driver 128 may receive a signal 192 from control device 102 and signal 152 from clock and data recovery circuit 126, and may provide signal 154 to drive electro-absorption modulator 114. In some implementations, signal 192 may be a control signal (e, to control an amplitude a crossing, and/or the like). In some implementations, signal 154 may be a high speed electrical radio frequency data signal.

Modulator bias circuit 130 includes one or more components to control a bias applied to electro-absorption modulator 114. For example, modulator bias circuit 130 may receive signal 186 from control device 102 (e.g., a signal associated with controlling a voltage of a power supply of modulator bias circuit 130 based on a temperature associated with TOSA 104 or with optical device 100), and may provide a signal 156. Signal 156 and signal 154 are combined by combine block 132 to form signal 158, which is received by electro-absorption modulator 114 to modulate beam 164.

As indicated above, FIG. 1 is provided merely as an example. Other examples are possible and may differ from what was described with regard to FIG. 1.

Figure 2:
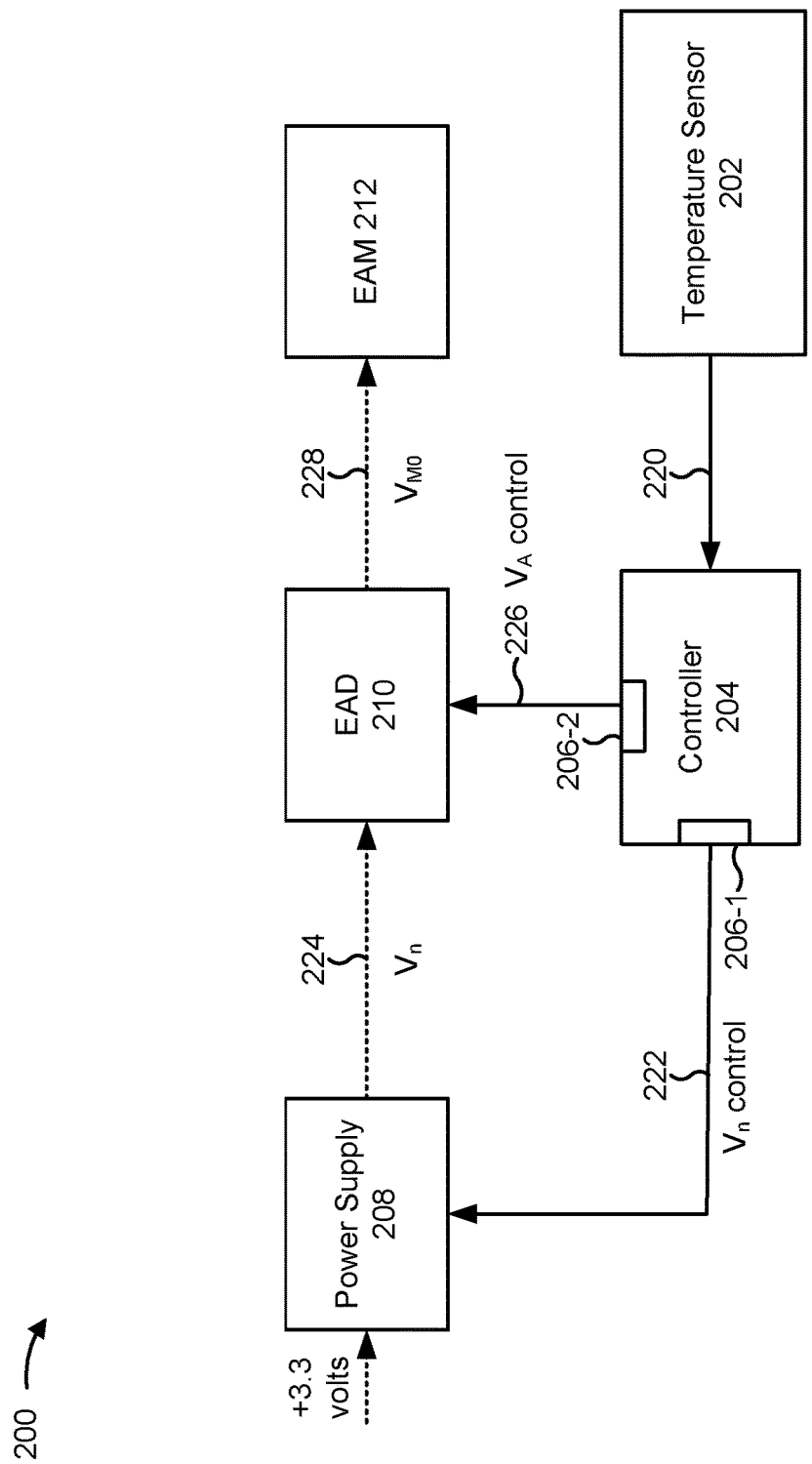
FIG. 2 is a diagram of an example of an electro-absorption bias circuit for an electro-absorption modulator described herein.

FIG. 2 is a diagram of an example implementation of an electro-absorption bias circuit 200. As shown in FIG. 2, electro-absorption bias circuit 200 includes a temperature sensor 202, a controller 204, which includes digital-to-analog converters 206-1 and 206-2, a power supply 208, an electro-absorption driving circuit 210 (shown as EAD 210), and an electro-absorption modulator 212 (shown as EAM 212). In some implementations, temperature sensor 202 corresponds to temperature sensor 124 shown in FIG. 1. In some implementations, controller 204 corresponds to control device 102 shown in FIG. 1. In some implementations, power supply 208 and electro-absorption driving circuit 210 may be components of modulator bias circuit 130 shown in FIG. 1. In some implementations, electro-absorption modulator 212 corresponds to electro-absorption modulator 114 shown in FIG. 1.

As further shown in FIG. 2, and by reference number 220, controller 204 may receive information from temperature sensor 202. For example, controller 204 may receive information identifying an ambient temperature related to a location at which electro-absorption bias circuit 200 is operating (e.g., the location at which a TOSA that is coupled to electro-absorption bias circuit 200 is operating). Additionally, or alternatively, controller 204 may receive information from temperature sensor 202 identifying an operating temperature of a TOSA to which controller 204 is coupled and/or the like.

As further shown in FIG. 2, and by reference number 222, controller 204 may provide a first signal to power supply 208. In some implementations, power supply 208 may be a variable negative voltage power supply that provides direct current (DC). For example, controller 204 may utilize digital-to-analog converter 206-1 to provide a first signal that is a function of an ambient temperature of an optical device that includes controller 204 to control a direct current output voltage, $V_n$, provided by power supply 208. In some implementations, power supply 208 may include a negative power supply. For example, power supply 208 may receive an input direct current voltage of (e.g., +3.3 volts), and may provide an output voltage $V_n$ that is less than 0 volts (e.g., −4.5 volts, −4 volts, −3.5 volts, −3 volts and/or the like) based on the input direct current voltage and the first signal 222. As shown by reference number 224, power supply 208 may provide the output voltage to electro-absorption driving circuit 210 to allow electro-absorption driving circuit 210 to drive electro-absorption modulator 212 (e.g., to provide a bias voltage 228, denoted $V_{M0}$, to electro-absorption modulator 212). In some implementations, bias voltage 228 corresponds to signal 156 shown in FIG. 1.

As further shown in FIG. 2, and by reference number 226, controller 204 provides a second signal 226, denoted $V_A$ control, to control the bias voltage 228 applied by electro-absorption driving circuit 210. As shown by reference number 228, based on providing the first signal to power supply 208 to cause power supply to provide negative output voltage $V_n$ to electro-absorption driving circuit 210 and based on providing the second signal to electro-absorption driving circuit 210, controller 204 causes electro-absorption driving circuit 210 to apply a bias voltage to electro-absorption modulator 212. Accordingly, a bias voltage 228 $V_{M0}$ can be provided to the electro-absorption modulation 212 using a variable output voltage 224 $V_n$ from power supply 208. This is advantageous because a power supply 208 dissipates less power operating at a less negative output voltage 224 $V_n$ than when operating at a more negative output voltage and a less negative output voltage can be requested by first signal 222 $V_n$ control when the controller 204 identifies a higher temperature from temperature sensor 202. Accordingly, power dissipation of electro-absorption bias circuit 200 can be reduced at higher temperatures. For example, based on using a temperature-dependent control signal to cause a temperature dependent output voltage, the temperature-dependent output voltage may be associated with reduced power consumption and/or power dissipation for varying temperatures relative to using a constant output voltage for varying temperatures and/or relative to another technique where a temperature-dependent control signal and/or a temperature-dependent output voltage is not used.

In some implementations, multiple electro-absorption modulators may be connected to a single power supply. For example, power supply 208 may provide a negative output voltage to multiple electro-absorption modulators 212 via multiple electro-absorption driving circuits 210, a single electro-absorption driving circuit 210, and/or the like. In some implementations, power supply 208 may provide a common voltage to each of the multiple electro-absorption modulators 212. Additionally, or alternatively, power supply 208 may provide a first voltage to a first electro-absorption modulator 212 and a second, different voltage to a second electro-absorption modulator 212 (e.g., based on different control signals indicating different operating temperatures and/or the like).

As indicated above, FIG. 2 is provided merely as an example. Other examples are possible and may differ from what was described with regard to FIG. 2.

FIG. 3 is a flow chart of an example process 300 for controlling an electro-absorption bias circuit for an electro-absorption modulator described herein. In some implementations, one or more process blocks of FIG. 3 may be performed by control device 102. In some implementations, one or more process blocks of FIG. 3 may be performed by another device or a group of devices separate from or including control device 102, such as TOSA 104, thermo-electric cooler 106, thermistor 108, photodiode 110, laser diode 112, electro-absorption modulator 114, lens 116, fiber 118, photodiode monitor 120, thermo-electric cooler controller 122, temperature sensor 124, clock and data recovery circuit 126, modulator driver 128, modulator bias circuit 130, laser bias circuit 134, and/or the like.

As shown in FIG. 3, process 300 may include receiving input data (block 310). For example, control device 102 may receive. In some implementations, control device 102 may receive temperature data regarding the TOSA (e.g., TOSA 104). For example, control device 102 may receive data from a temperature sensor identifying an ambient temperature of a location at which the TOSA is operating, an internal temperature of the TOSA, a temperature of a component of the TOSA (e.g., an electro-absorption modulator of the TOSA), and/or the like. In some implementations, control device 102 may receive the temperature data from a temperature sensor, a thermistor, and/or the like.

In some implementations, control device 102 may receive other input data, such as input data identifying an input voltage for a power supply of an electro-absorption driving circuit, input data identifying a minimum voltage that is to be supplied to an electro-absorption modulator bias circuit, and/or the like. In some implementations, control device 102 may receive input data identifying a power dissipation capability of the TOSA.

As further shown in FIG. 3, process 300 may include determining a set of control signals for a power supply and a driving circuit (block 320). For example, control device 102 may determine the set of control signals for the power supply (e.g., power supply 208) and the driving circuit (e.g., electro-absorption driving circuit 210). In some implementations, control device 102 may determine the signals based on the input data. For example, control device 102 may provide a first control signal to the driving circuit to control a level of voltage from the driving circuit, and a second control signal to the power supply to control a direct current voltage provided to the driving circuit to enable the driving circuit to provide the level of voltage from the driving circuit. As temperature changes, control device 102 may alter the control signals to alter the voltage provided by the power supply to the driving circuit and by the driving circuit to an electro-absorption modulator so as to reduce power consumption and/or power dissipation by the power supply and/or the driving circuit. For example, based on receiving data indicating that a temperature has decreased, control device 102 may determine a control signal to increase an absolute value of the voltage (e.g., to cause the negative voltage to be more negative). Additionally, or alternatively, based on receiving data indicating that the temperature has increased, control device 102 may determine a control signal to decrease an absolute value of the voltage.

In some implementations, control device 102 may determine a control signal based on a rate of change of the temperature. For example, control device 102 may determine a predicted temperature based on the rate of change of the temperature, and may determine the control signal to control a level of voltage based on the predicted temperature. In some implementations, control device 102 may use a proportional-integral-derivative control technique to control the level of voltage based on the temperature, the rate of change of temperature, and/or the like. Additionally, or alternatively, control device 102 may utilize another type of control technique to determine the control signal to control the level of voltage based on data identifying the temperature.

In some implementations, control device 102 may determine the set of control signals based on the electro-absorption modulator being reverse biased. For example, the TOSA may include a forward biased laser diode optically coupled to a reverse biased electro-absorption modulator, such that:

$$V_M \leq 0;$$

$$V_M = V_{M0} + v_m$$

where $V_M$ represents a modulated voltage input to the electro-absorption modulator to generate a current in the electro-absorption modulator to modulate a beam provided by the laser diode for optical communications, $V_{MO}$ represents a required bias voltage applied to the electro-absorption modulator as $V_A$, and $v_m$ represents a modulation voltage for modulating an optical power. In some implementations, $V_{MO}$ is temperature dependent. For example, control device 102 may provide a signal to alter $V_A$ based on an alteration to an operating temperature of the TOSA to configure (e.g., to optimize) an optical signal provided as output and via a fiber. In this case, $V_{MO}$ decreases (e.g., is more negative) as temperature is reduced and increases (e.g., is more positive) as temperature is increased.

In some implementations, control device 102 may determine the set of control signals based on the modulated optical power of the TOSA being related to the modulation voltage. For example, in non-return-to-zero (NRZ) modulation:

$$F(V_{M0}+v_m)=P_0;$$

$$F(V_{M0})=P;$$

$$F(V_{M0}-v_m)=P_1;$$

where $P_0$ represents a minimum modulated optical power, P represents an average modulated optical power, and $P_1$ represents a maximum modulated optical power. In this case, control device 102 may determine the set of control signals to ensure that the minimum modulated optical power and the maximum modulated optical power are each achievable by the electro-absorption modulator based on a bias voltage applied to the electro-absorption modulator.

In some implementations, the voltage provided by the power supply to the electro-absorption driving circuit is a function of the required input voltage with respect to an operating temperature of the electro-absorption modulator, such that:

$$V_n \leq \min[V_{m0}(T)];$$

where $V_n$ represents a voltage provided by the power supply to the electro-absorption driving circuit, $V_{M0}$ represents a voltage applied to the electro-absorption modulator, and T represents the operating temperature of the electro-absorption modulator. For example, the negative power supply may receive an input voltage (e.g., +3.3 volts) and may provide an output voltage of $V_n$ based on the input voltage and a signal from control device 102.

In some implementations, control device 102 may determine the set of control signals to alter a bias applied to the electro-absorption modulator. For example, control device 102 may determine the set of control signals, such that a relatively lower temperature may correspond to a relatively greater (i.e., more negative, greater absolute value) value for $V_{MO}$, and a relatively higher temperature may correspond to a relatively lesser (i.e., less negative, lesser absolute value) value for $V_{MO}$. During operation of control device 102, the electro-absorption modulator may be set such that:

$$\min[V_A(T)]=-4 \text{ volts};$$

where $V_A$ is a voltage applied by the electro-absorption driver circuit to cause a bias applied to the electro-absorption modulator to be $V_{MO}$. In this case, control device 102 may determine the set of control signals to set $V_n$ to a value less than −4 volts. In some implementations, a controller may determine the set of control signals to set the value for $V_n$ to differ from −4 volts by a delta value (e.g., a factor of safety), such as −4.2 volts, −4.5 volts, −5 volts, and/or the like. Although described herein in terms of a particular value for $V_{MO}$ and a particular delta value, other values are possible.

As further shown in FIG. 3, process 300 may include providing the set of control signals (block 330). For example, control device 102 may provide the set of control signals. In some implementations, control device 102 may convert the set of control signals before providing the set of control signals. For example, a digital-to-analog converter of control device 102 may convert the set of control signals to analog signals and provide the analog signals. In some implementations, control device 102 may provide the set of control signals without converting the set of control signals. For example, an analog circuit that is implemented for electro-absorption bias circuit 200 may receive analog input data regarding a temperature of an electro-absorption modulator and provide an analog signal as output without using digital signaling.

In some implementations, control device 102 may provide multiple signals. For example, control device 102 may provide a first signal to a negative power supply to control $V_n$, the output voltage of the negative power supply, and a second signal to control $V_A$, the voltage applied by the electro-absorption driving circuit to cause a bias, $V_{MO}$, to be applied to the electro-absorption modulator. In this case, when a temperature of the TOSA is increased, a voltage provided by the power supply is decreased, thereby reducing power consumption and/or a power dissipation requirement.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

In this way, based on dynamically altering a power supply voltage output using a temperature-dependent control signal, a power dissipation requirement may be reduced by greater than 50 milliwatts, greater than 75 milliwatts, greater than 100 milliwatts, and/or the like relative to utilizing a power supply with a constant voltage output.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, and/or the like.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. An electro-absorption bias circuit, comprising:
   a temperature sensor;
   a controller to:
      provide, to a power supply, a temperature-dependent control signal based on data received from the temperature sensor;
   the power supply to:
      provide an output voltage based on receiving the temperature-dependent control signal from the controller; and
   an electro-absorption driving circuit to:
      output a bias voltage applied to the output voltage provided by the power supply.

2. The electro-absorption bias circuit of claim 1, where the electro-absorption driving circuit is further to:

apply the bias voltage based on another control signal received from the controller.

3. The electro-absorption bias circuit of claim 2, where the other control signal is another temperature-dependent control signal determined based on the data received from the temperature sensor.

4. The electro-absorption bias circuit of claim 1, where the controller is further to:
identify an alteration to a temperature based on the data received from the temperature sensor, and
determine, based on identifying the alteration to the temperature, the temperature-dependent control signal to alter an absolute value of the output voltage provided by the power supply.

5. The electro-absorption bias circuit of claim 1, where the power supply is a negative power supply.

6. The electro-absorption bias circuit of claim 1, where the output voltage provided by the power supply is a direct current output voltage that is a function of a temperature of an electro-absorption modulator.

7. The electro-absorption bias circuit of claim 1, where the data received from the temperature sensor is temperature data regarding a temperature of an electro-absorption modulator.

8. The electro-absorption bias circuit of claim 1, where the temperature-dependent control signal causes a power consumption or a power dissipation by the electro-absorption driving circuit that is less than a threshold.

9. An optical device, comprising:
a temperature sensor;
a control device to:
provide, to a variable negative voltage power supply, a temperature-dependent control signal based on data received from the temperature sensor;
a modulator bias circuit comprising the variable negative voltage power supply,
the variable negative voltage power supply to:
receive the temperature-dependent control signal from the control device, and
provide, based on the temperature-dependent control signal, a negative voltage that is a function of a temperature associated with the optical device; and
a transmit optical sub-assembly (TOSA) comprising:
a laser diode to provide a beam, and
an electro-absorption modulator to modulate the beam based on the negative voltage.

10. The optical device of claim 9, where the control device is a processor, a microprocessor, a controller, or an analog circuit.

11. The optical device of claim 9, where the control device is further to:
identify an alteration to the temperature, and
determine, based on identifying the alteration to the temperature, the temperature-dependent control signal to alter the negative voltage.

12. The optical device of claim 9, where the temperature is associated with an operating temperature of at least one of:
the TOSA,
the laser diode, or
the electro-absorption modulator.

13. The optical device of claim 9, where the temperature sensor is to:
determine the temperature, and
provide the data to the control device to identify the temperature.

14. The optical device of claim 9, where the variable negative voltage power supply receives a direct current (DC) voltage.

15. The optical device of claim 9, where the modulator bias circuit further comprises:
an electro-absorption driving circuit to:
receive the negative voltage, and
apply a bias voltage to the electro-absorption modulator.

16. The optical device of claim 9, where the negative voltage that is the function of the temperature is associated with reduced power consumption or reduced power dissipation relative to a constant negative voltage that is not a function of the temperature.

17. A method, comprising:
receiving, by a control device, input data,
the input data including information identifying a temperature associated with a laser diode and an electro-absorption modulator;
determining, by the control device and based on the information identifying the temperature, a set of temperature-dependent control signals for a power supply and a driving circuit,
the set of temperature-dependent control signals to alter a bias applied to the electro-absorption modulator based on the temperature; and
providing, by the control device, the set of temperature-dependent control signals to the power supply and the driving circuit to:
alter an output voltage, of the power supply applied to the driving circuit based on the temperature, and
alter the bias, applied by the driving circuit to the electro-absorption modulator, based on the temperature.

18. The method of claim 17, further comprising:
identifying a reduction to the temperature based on the input data; and
where determining the set of temperature-dependent control signals comprises:
determining, based on identifying the reduction to the temperature, the set of temperature-dependent control signals to increase an absolute value of the output voltage of the power supply.

19. The method of claim 17, further comprising:
identifying an increase to the temperature based on the input data; and
where determining the set of temperature-dependent control signals comprises:
determining, based on identifying the increase to the temperature, the set of temperature-dependent control signals to decrease an absolute value of the output voltage of the power supply.

20. The method of claim 17, where a power dissipation requirement associated with the output voltage is less than 100 milliwatts.

21. The method of claim 17, where the power supply is a direct current negative voltage power supply.

22. The method of claim 17, where the laser diode is included in an optical transceiver associated with a data rate of at least 100 gigabits per second.

23. The method of claim 17, where the set of temperature-dependent control signals cause the output voltage to vary based on temperature and to be associated with at least one of: a reduced power consumption or a reduced power dissipation relative to a constant output voltage that does not vary based on temperature.

* * * * *